(12) United States Patent
McLaren et al.

(10) Patent No.: US 8,059,443 B2
(45) Date of Patent: Nov. 15, 2011

(54) THREE-DIMENSIONAL MEMORY MODULE ARCHITECTURES

(75) Inventors: Moray McLaren, Bristol (GB); Jung Ho Ahn, Palo Alto, CA (US); Alan Lynn Davis, Coalville, CA (US); Nathan Lorenzo Binkert, Redwood, CA (US); Norman Paul Jouppi, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 212 days.

(21) Appl. No.: 11/975,963

(22) Filed: Oct. 23, 2007

(65) Prior Publication Data

US 2009/0103345 A1    Apr. 23, 2009

(51) Int. Cl.
*G11C 13/04* (2006.01)
(52) U.S. Cl. ............... 365/64; 365/230.03; 365/51
(58) Field of Classification Search ............ 365/64, 365/230.03, 51
See application file for complete search history.

(56) References Cited

U.S. PATENT DOCUMENTS

| | | | |
|---|---|---|---|
| 5,361,233 A * | 11/1994 | Kotani | 365/207 |
| 5,481,133 A | 1/1996 | Hsu | |
| 5,652,811 A | 7/1997 | Cook | |
| 5,731,945 A * | 3/1998 | Bertin et al. | 361/111 |
| 6,208,545 B1 | 3/2001 | Leedy | |
| 6,462,977 B2 * | 10/2002 | Butz | 365/63 |
| 6,477,286 B1 | 11/2002 | Ouchi | |
| 6,480,433 B2 * | 11/2002 | Huffman | 365/201 |
| 6,636,668 B1 | 10/2003 | Al-hemyari | |
| 6,885,099 B2 | 4/2005 | Ogawa | |
| 6,934,450 B2 | 8/2005 | Hiramatsu | |
| 6,999,370 B2 * | 2/2006 | Luk et al. | 365/226 |
| 7,123,497 B2 * | 10/2006 | Matsui et al. | 365/51 |
| 7,138,295 B2 * | 11/2006 | Leedy | 438/109 |
| 7,177,171 B2 | 2/2007 | Kasai | |
| 7,327,600 B2 | 2/2008 | Norman | |
| 7,532,785 B1 | 5/2009 | Beausoleil | |
| 2002/0039464 A1 | 4/2002 | Yoshimura | |
| 2003/0155656 A1 * | 8/2003 | Chiu et al. | 257/774 |

(Continued)

FOREIGN PATENT DOCUMENTS

WO    WO 2006046801 A1 *  5/2006

OTHER PUBLICATIONS

U.S. Appl. No. 11/977,350, Non-Final Rejection dated May 3, 2010, pp. 1-6 and attachments.

(Continued)

*Primary Examiner* — Tuan Nguyen
*Assistant Examiner* — Lance Reidlinger

(57) ABSTRACT

Various embodiments of the present invention are directed to stacked memory modules. In one embodiment of the present invention, a memory module comprises at least one memory-controller layer stacked with at least one memory layer. Fine pitched through vias (e.g., through silicon vias) extend approximately perpendicular to a surface of the at least one memory controller through the stack providing electronic communication between the at least one memory controller and the at least one memory layers. Additionally, the memory-controller layer includes at least one external interface configured to transmit data to and from the memory module. Furthermore, the memory module can include an optical layer. The optical layer can be included in the stack and has a bus waveguide to transmit data to and from the at least one memory controller. The external interface can be an optical external interface which interfaces with the optical layer.

16 Claims, 17 Drawing Sheets

U.S. PATENT DOCUMENTS

| | | |
|---|---|---|
| 2004/0150081 A1 | 8/2004 | Ogawa |
| 2005/0023656 A1* | 2/2005 | Leedy ........................... 257/678 |
| 2006/0164882 A1* | 7/2006 | Norman ........................ 365/158 |
| 2007/0070669 A1 | 3/2007 | Tsern |
| 2007/0090507 A1 | 4/2007 | Lin |
| 2007/0147845 A1 | 6/2007 | Epitaux |
| 2008/0151950 A1 | 6/2008 | Lin |
| 2009/0103855 A1 | 4/2009 | Binkert |

OTHER PUBLICATIONS

U.S. Appl. No. 11/975,974, Non-Final Rejection dated Sep. 15, 2008, pp. 1-10 and attachments.

U.S. Appl. No. 11/975,974, Notice of Allowance dated Mar. 31, 2009, pp. 1-5 and attachments.

* cited by examiner

THREE-DIMENSIONAL MEMORY MODULE ARCHITECTURES

CROSS REFERENCE TO RELATED APPLICATIONS

This patent application may contain subject matter related to the following patent applications, all of which are hereby incorporated by reference: (1) U.S. patent application Ser. No. 11/975,975 entitled "PHOTONIC INTERCONNECTS FOR COMPUTER SYSTEM DEVICES," having inventors Raymond G. Beausoleil, Marco Fiorentino, Norman Paul Jouppi, Qianfan Xu, Robert Samuel Schreiber, and Nathan Lorenzo Binkert; and (2) U.S. patent application Ser. No. 11/977,350 entitled "THREE-DIMENSIONAL DIE STACKS WITH INTER-DEVICE AND INTRA-DEVICE OPTICAL INTERCONNECT" having inventors Nathan Lorenzo Binkert; Norman Paul Jouppi; Alan Lynn Davis, and Raymond G. Beausoleil.

TECHNICAL FIELD

Embodiments of the present invention are directed to stacked three-dimensional memory modules.

BACKGROUND

An intrinsic problem shared by all computer systems is the need for increased main memory system performance without a commensurate increase in energy consumption or cost. Electrical communication architectures struggle to balance the dichotomy for increased performance required of electronic systems while addressing lower power consumption, smaller form factor, and lower electromagnetic emissions. Better solutions dealing with scalability while reducing power consumption in computer systems are desirable. However, typical electronic solutions to these problems often increase the cost of the memory modules either because of increased pin count and/or die area, or increased power consumption, a major cause of which is the need to communicate over long wires.

A typical implementation example of a main memory system, in a computer system is one that can be implemented utilizing one or more dual in-line memory modules ("DIMMs"). A DIMM is a small circuit board that contains a number of discrete, dynamic random access memory ("DRAM") chips that are connected to a memory controller using electronic interconnects forming one or more channels on a system board. There are many ways to increase main memory performance, such as increasing capacity, increasing the number of channels, increasing the number of DRAM banks or ranks, improving bandwidth, decreasing latency, or some combination of these ways. However, typical electronic solutions to these problems often increase the cost of the memory modules either because of increased pin count and/or die area, or increased power consumption. As mentioned above, a major cause of the increased power consumption is the need to communicate over long wires. Increasing the front side bus speed also causes a linear increase in interface power consumption. An additional interconnect issue with increasing the number of DIMM ranks at increased front side bus speeds is that both signal timing and noise are problems in the multi-drop wires that connect multiple DIMMs. This so called "stub electronics" problem has led to memory buses being replaced by point to point memory channels requiring additional external buffers to interface to the DRAMs. However, most DRAM efforts have focused on the creation of higher density memory devices with an electrical DIMM to processor chip interconnect rather than a DIMM replacement.

What is desired is a memory module architecture providing high speed, high bandwidth interconnects without the power and cost considerations of additional pins and long wires and which also maintains signal integrity.

SUMMARY

Various embodiments of the present invention are directed to stacked memory modules. In one embodiment of the present invention, a memory module comprises a memory-controller layer including at least one memory controller. The memory module includes at least one memory layer in a stack with the memory-controller layer. At least one set of through vias extends approximately perpendicular to a surface of the at least one memory controller through the stack. The vias providing electronic communication between the at least one memory controller and one of the at least one memory layers. Additionally, the through-vias can be pitch matched with one or more elements in a layer of the stack. Some examples of such elements can be bit lines, sense amps and input/output buffers in a memory layer.

In another embodiment in accordance with the present invention, the memory module further comprises an optical layer. In one embodiment, the optical layer is a layer in the stack of the memory module and also includes at least one bus waveguide configured to transmit data to and from the at least one memory-controller layer. Additionally, the optical layer can be positioned between the memory controller layer and the at least one memory layers and the through vias extend through the optical layer.

DETAILED DESCRIPTION

Embodiments of the present invention are directed to stacked, three-dimensional memory modules including multiple internal data buses for reducing internal interconnect delays. The multiple internal data buses are implemented using through silicon vias allowing the memory modules to be organized as many small, high bandwidth sub-blocks leading to reduced access time and reduced power consumption.

Figure 1:
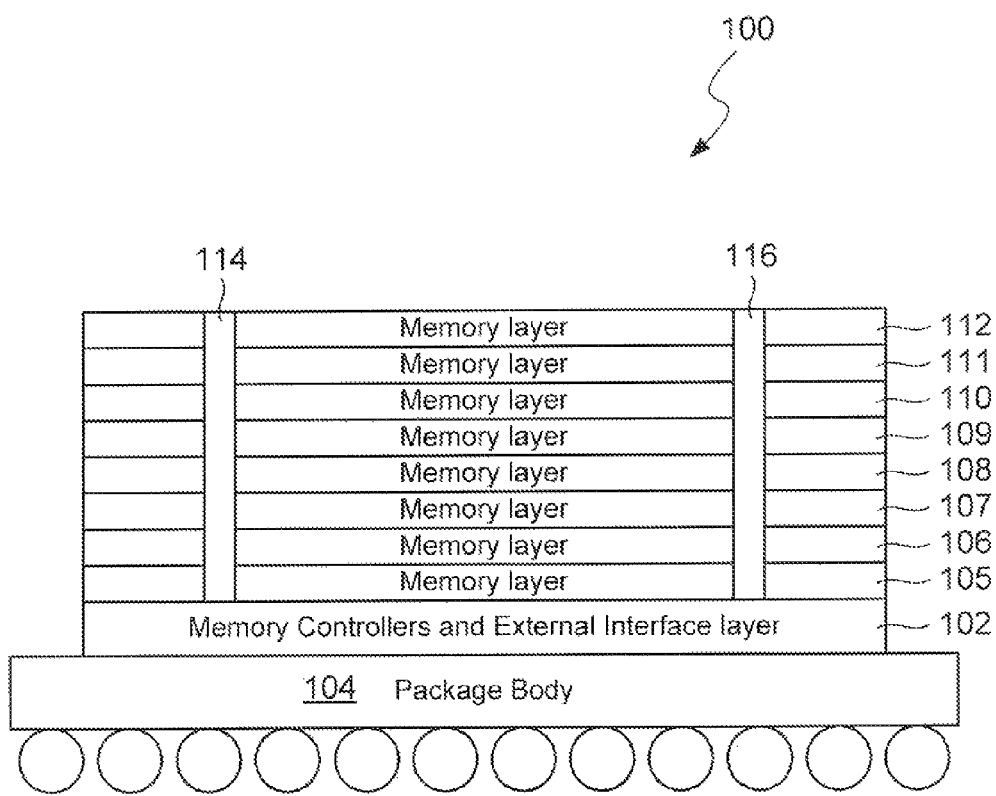
FIG. 1 shows a cross-sectional view of a first three-dimensional, electronic memory module in accordance with embodiments of the present invention.

FIG. 1 shows a cross-sectional view of a three-dimensional, electronic memory module ("memory module") 100 in accordance with embodiments of the present invention. In the illustrated example, the memory module 100 includes a memory-controller layer 102 disposed on the top surface of a package body 104 and a stack of eight individual memory layers 105-112 disposed on the top surface of the memory-controller layer 102. The memory layers 105-112 can be volatile memory layers, such as DRAM, non-volatile memory layers, or a combination of volatile and non-volatile memory layers. The memory-controller layer 102 and the memory layers 105-112 are complementary metal-oxide semiconductor ("CMOS") silicon devices connected by through vias, such as metalized or through silicon vias, that are approximately perpendicular to the memory-controller layer 102. FIG. 1 reveals two of the multiple through vias 114 and 116 extending approximately perpendicular from the top surface of the memory-controller layer 102 through each of the memory layers 105-112. The through vias are buses that enable address, control, and data electronic signals to be transmitted between the memory layers 105-112 and the memory-controller layer 102. The memory-controller layer 102 includes at least one high speed external electronic interface (not shown) to transmit data between the memory module 100 and a processor (not shown). Preferably, each layer is a die layer with thicknesses ranging between approximately 25-50 microns.

Figure 2A:
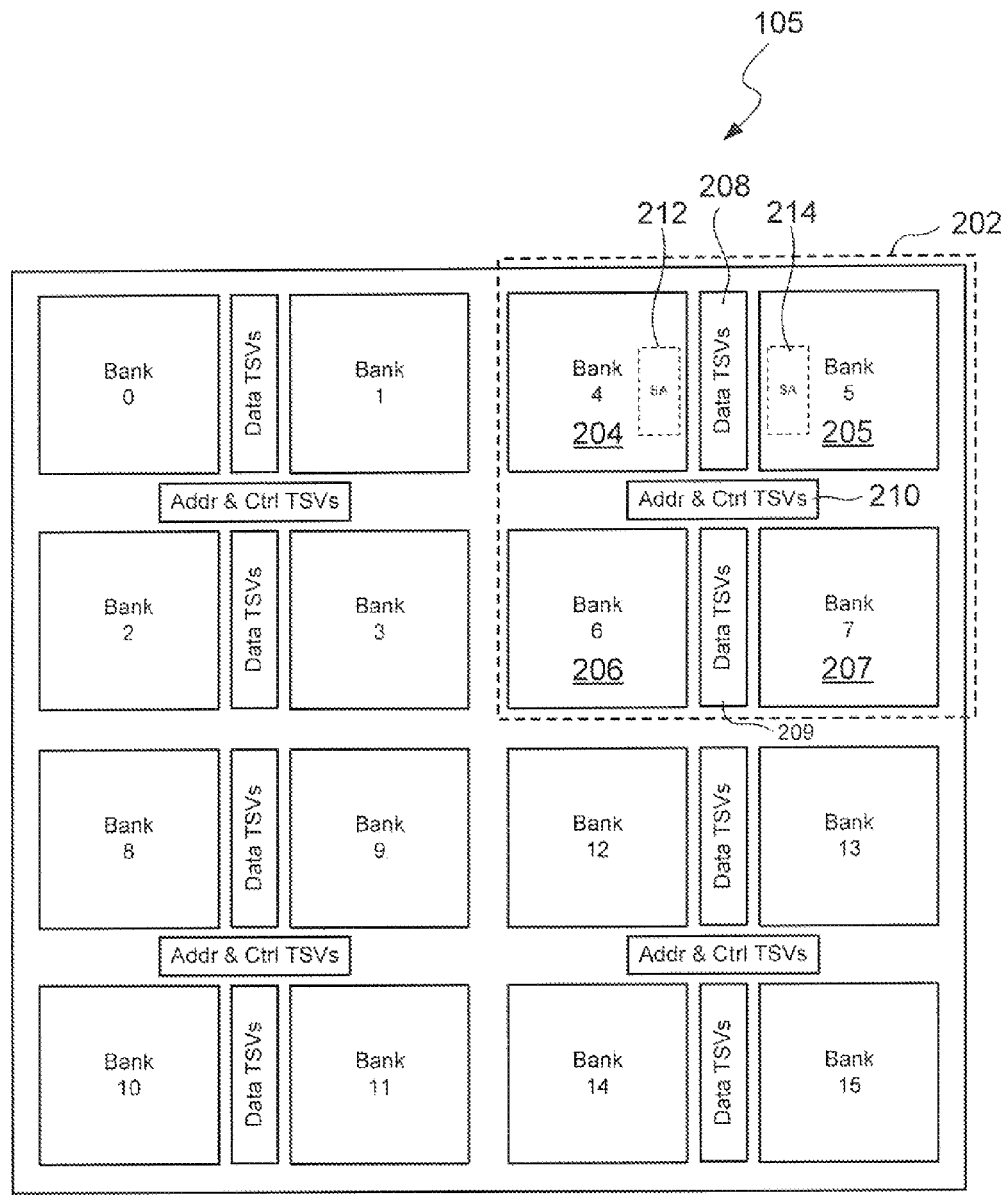
FIG. 2A shows an architecture of a memory layer of the memory module, shown in FIG. 1, in accordance with embodiments of the present invention.

FIG. 2A shows an architecture of a memory layer 105 of the memory module 100 in accordance with embodiments of the present invention. The memory layer 105 comprises sixteen banks, eight sets of data through vias, and four sets of address and control through vias. The memory layer 105 also represents the architectural floor plan of the remaining memory layers 106-112. Although not shown in memory layer 105, each bank includes a memory array, a row decoder, a column decoder, and sense amplifiers ("sense amps"). The banks of the memory layers include a plurality of memory cells which are arranged in rows and columns, and each memory cell stores data provided by one bit line and one word line. The sixteen banks of the memory layer 105 are arranged into four regions. A region is a number of banks that are in electronic communication with one or more sets of data through vias and with one or more sets of address and control through vias. Each set of data through vias and each set of address and control through vias are confined to sub-regions of the memory layer 105. For example, dashed-line rectangle 202 identifies a region of the memory layer 105 comprising four banks 204-207, two sets of data through vias 208 and 209, and one set of address and control through vias 210. The banks 204 and 205 are in electronic communication with the data through vias 208, and the banks 206 and 207 are in electronic communication with the data through vias 209. The data through vias 208 provide for data transmission between the two banks 204 and 205 and a memory controller (not shown), and the data through vias 209 provide for data transmission between the two banks 206 and 207 and the same memory controller. In addition, all four banks 204-207 of the region 202 are in electronic communication with the address and control through vias 210 in order to communicate the physical address of data stored in the banks 204-207, to send and receive commands from the memory controller, and get status signals from the banks, such as signals indicating whether the memory controller was reading data from or writing data to memory in the banks 204-207.

Note that in order to minimize the interconnection distance between the banks and the data through vias buses, the data through vias can be arranged in line with the sense amps and the input/output logic (not shown) which transfer data to and from the banks. The pitch of the through vias may be selected to increase the data bus width, and consequently the bandwidth available to and from any individual bank. The term "pitch" refers to the center-to-center spacing of the through vias, where the through vias can be arranged in an approximately regular pattern. A fine pitch is preferred. A pitch less than approximately 50 microns can be used or preferably a pitch of approximately 25 microns. A pitch of approximately 25 microns is larger than the pitch of typical bank bit lines which may be approximately 0.1 microns. As a result, in certain embodiments, the memory layer architectures may be configured so that a number of bit lines share the same through via. For example, DRAM memory layers can be configured so that 256 bit lines share the same through via. Thus, a block of bit lines is approximately 25.6 microns wide. The through vias can be spaced at approximately 25.6 microns so that the through vias are pitch matched to the bit lines. Pitch matched can be thought of as where two or more different types of objects are arrayed on the same pitch so that the wiring between them is minimized, and the wiring pattern is identical and repeated. In other embodiments, an even finer pitch of approximately 12 microns may result in twice as many through vias positioned along an edge of a bank, which would double the memory bandwidth from the memory to the memory controller. The arrangement of the four banks, the two sets of data through vias, and the set of address and control through vias within each of the four sub-regions of the memory layer 105 minimizes the interconnection distance between the sense amps of the buffers and the data through vias. For example, the banks 204 and 205 are configured so that interconnection distances between the sense amps 212 and 214 and the data through vias 208 are at a minimum.

Figure 2B:
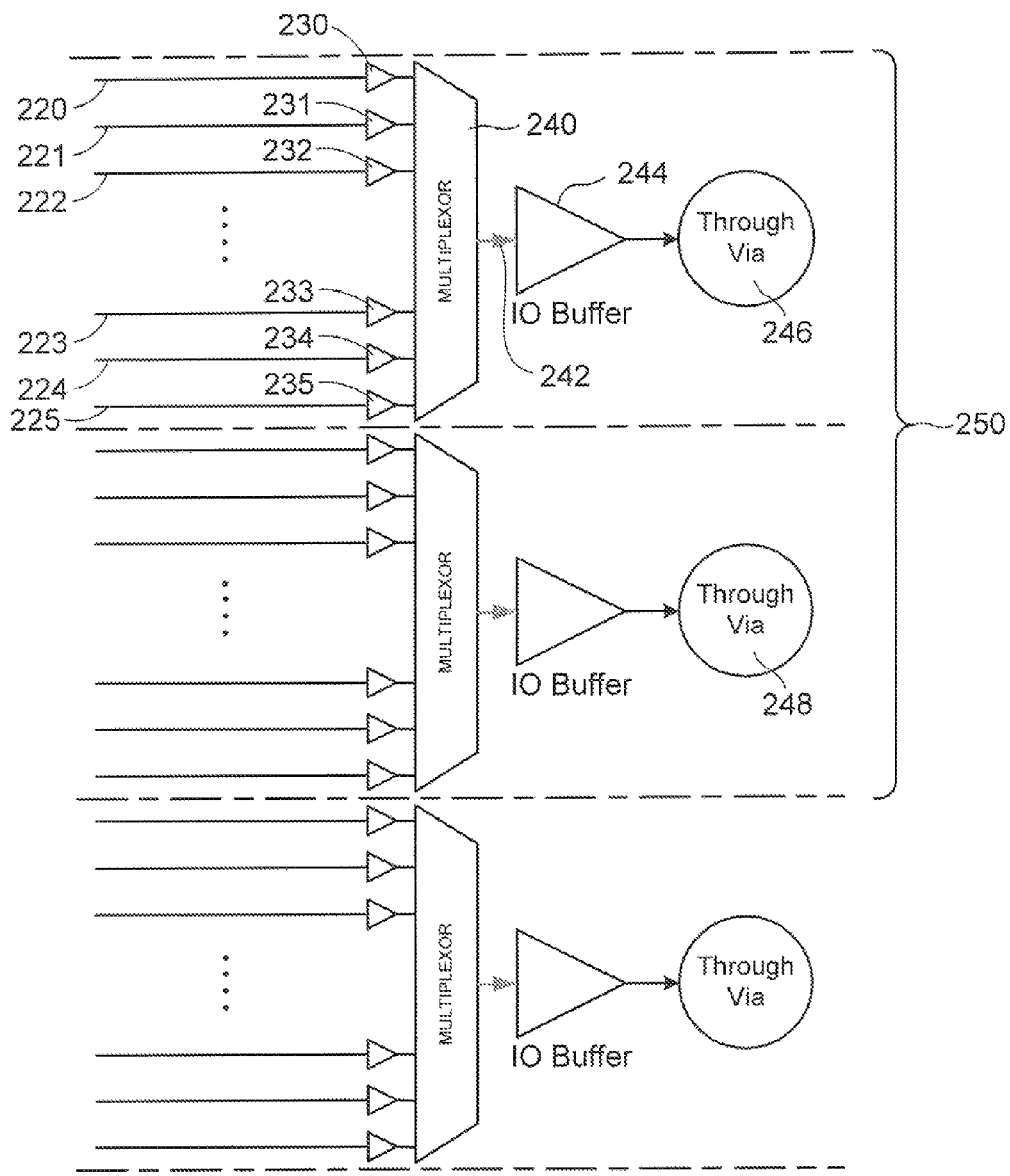
FIG. 2B shows a schematic representation of an arrangement of bit lines, sense amplifiers, input/output drivers, and through vias to minimize wire length by matching the pitch of the various elements in accordance with embodiments of the present invention.

FIG. 2B shows a schematic representation of an arrangement of bit lines, sense amps, input/output drivers and through silicon vias that minimizes the length of wires by matching the pitch of the various elements in accordance with embodiments of the present invention. Each bit line is connected to a sense amp. For example, bit lines 220-225 are connected to sense amps 230-235. Each of the sense amps amplifies the voltage associated with the bits coming off of the bit lines which helps to reduce time delays and power consumption. The output from the sense amps is then transmitted to a corresponding multiplexer which combines the outputs from the sense amps into a single selected data output. The outputs from the sense amps 230-235, for example, are transmitted to the multiplexer 240 and combined into a selected data output 242. The selected data output from each multiplexer is buffered by a corresponding input/output buffer, such as input/output buffer 244, and transmitted to a corresponding memory controller via connected through vias, such as through vias 246. The physical layout on silicon of the bit lines, sense amps, input/output buffers and the through vias may be arranged such that the pitch of each is nearly equal to or a multiple of the others, such that the pattern of wiring repeats regularly across all the data through vias of a memory array.

In addition to matching the pitch between the bit lines and the through vias for optimal layout, there can be a matching between the bandwidth of the bit lines and the through vias. For example, assume that the schematic representation of the bit lines shown in FIG. 2B comprises 512 rows of bits lines in a mat 250, and the bit lines are signaled at a memory-clock rate of 200 MHz. The mat 250 also includes two through vias 246 and 248 that are signaled at a much higher data-clock rate of approximately 3.2 GHz. Because of the 16:1 ratio of signaling rates between the data clock and the memory clock, multiple bits from the mat 250 can be time division multiplexed over the through vias 246 and 248 on each data clock. For each data clock cycle, 32 bits are read out of the mat 250 and 16 bits are read on each through via. Thus, an entire cache line can be read out of the mat 250 in 16 data clock cycles. The benefit of this approach is that a significant amount of power is saved because all bits read out of the mat 250 are used. In a conventional DRAM however, multiple mats are accessed and will typically drive their contents to a 4096 bit row buffer, but on any column access to a particular DRAM component only 8 of these 4096 bits are driven to the chip outputs during a given data-transfer. Multiple data transfer cycles may be associated with a given column access. For example, if the column size was 16 bytes (128 bits) and the typical DRAM channel size is 64 bits then two data transfer cycles would follow each column address command. In this example, if the cache line size is 64 bytes (512 bits) and the column size is 16 bytes (as described above) then 4 column access commands (or 8 data transfer cycles) would be necessary to deliver a single cache line. In this invention, accessing an entire cache line will only require a single command, thereby reducing control overhead and latency. In addition, this invention will utilize all of the bits read into the row buffer rather than a small fraction (64 bits which results in a significant power savings).

Figure 3A:
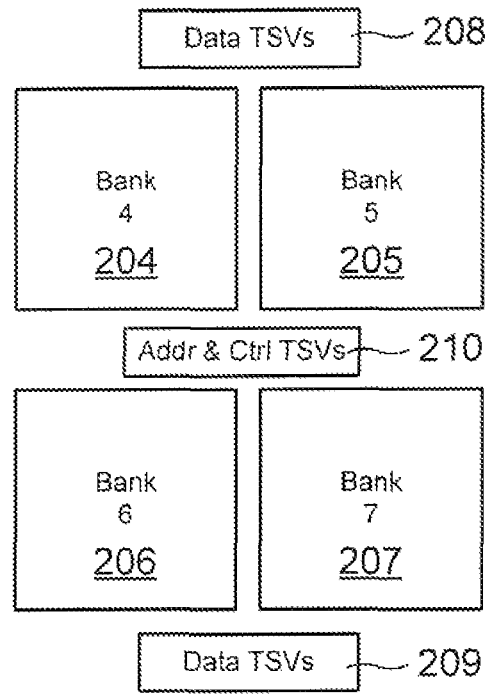
FIGS. 3A-3B show two possible ways in which four banks, two data through vias, and an address and control through vias can be arranged in accordance with embodiments of the present invention.
Figure 3B:
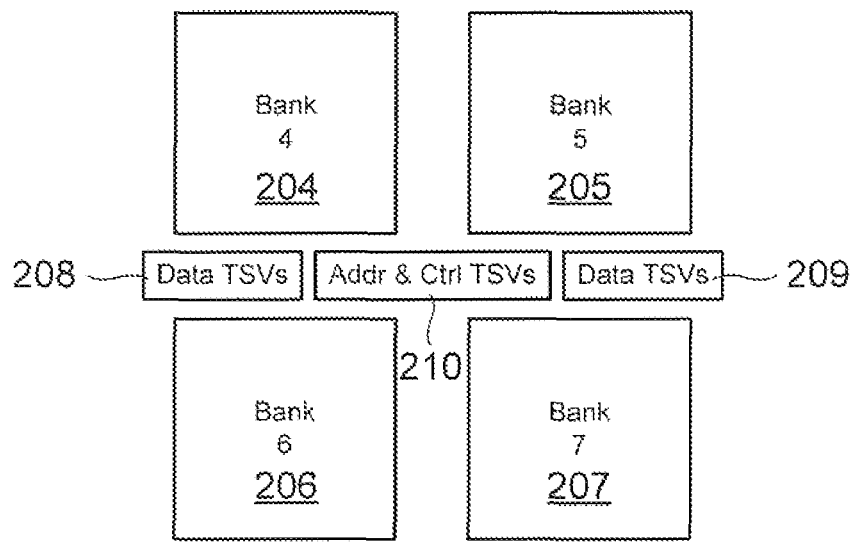

Although the arrangement of banks, data through vias, and address and control through vias within the four regions of the memory layer 105, shown in FIG. 2, represents an optimum arrangement of these devices, other arrangements of the same devices are possible. FIGS. 3A-3B show just two possible ways in which the four banks 204-207, the two data through vias 208 and 209, and the address and control through vias 210 can be arranged in accordance with embodiments of the present invention. In other embodiments, the banks, data through vias, and address and control through vias comprising a region can have any number of different suitable arrangements. In addition, regions of a memory layer are not limited to four banks, two sets of data through vias, and one set of address and control through vias. In other embodiments, a region can have any number of banks in electronic communication with any number of sets of data through vias and any number of set of address and control through vias. In other embodiments, a memory layer can be configured with one, two, three, five, nine, sixteen, or any number of regions, each region having any suitable number of banks, sets of data through vias, and sets of address and control through vias. The regions can be arranged into a square, as shown in FIG. 2, a rectangle, a row, or into any other suitable arrangement of regions. In other embodiments, the number of memory layers of the memory module 100 can be reduced or increased as needed.

Figure 4:
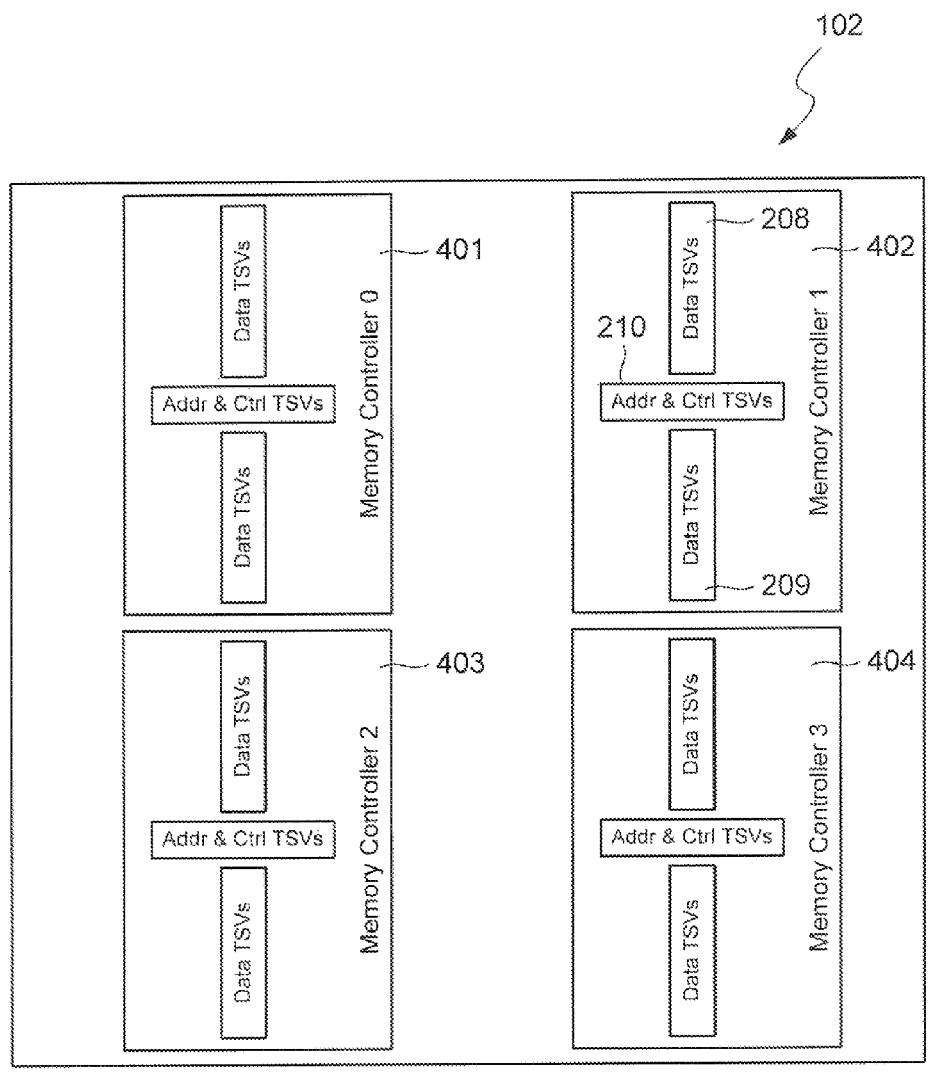
FIG. 4 shows an architecture of a memory-controller layer of the memory module, shown in FIG. 1, in accordance with embodiments of the present invention.

FIG. 4 shows an architecture of the memory-controller layer 102 of the memory module 100 in accordance with embodiments of the present invention. The memory-controller layer 102 includes four memory controllers 401-404. Each memory controller is in electronic communication with two sets of data through vias and one set of address and control through vias, which are, in turn, in electronic communication with four banks of a particular region in each of the memory layers 105-112. For example, the memory controller 402 is in electronic communication with the data through vias 208 and 209 and the address and control through vias 210.

Figure 5:
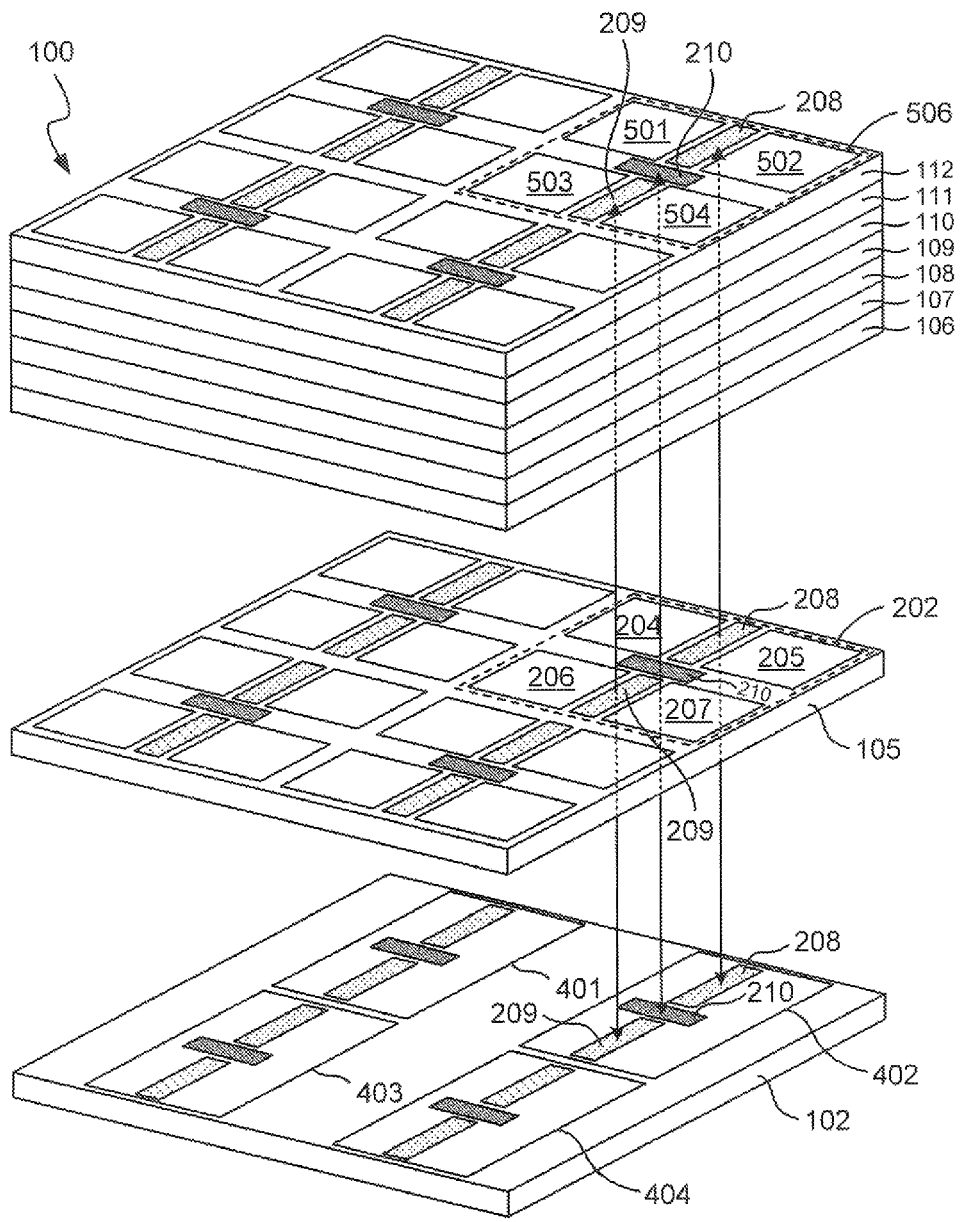
FIG. 5 shows an exploded isometric view of the memory module, shown in FIG. 1, in accordance with embodiments of the present invention.

FIG. 5 shows an exploded isometric view of the memory module 100 in accordance with embodiments of the present invention. The memory layer 105 and memory-controller layer 102 are shown separated from the remaining memory layers 106-112 in order to reveal the alignment of the memory controllers 401-404 of the memory-controller layer 102 with the regions of the memory layers 105-112. FIG. 5 also reveals that the sets of data through vias and the sets of address and control through vias are buses extending through the memory layers 105-112 approximately perpendicular to the memory controllers 401-404. The banks of each region within each memory layer are in electronic communication with one of the four memory controllers by way of two sets of data through vias and one set of address and control through vias. For example, as shown in FIG. 5, the memory controller 402 can be in electronic communication with the banks 204-207 of the region 202 via the data through vias 208 and 209 and the address and control through vias 210, and the memory controller 402 can be in electronic communication with four banks 501-504 of a region 506 of the memory layer 112 via the same data through vias 208 and 209 and the same address and control through vias 210. Each memory controller regulates the flow of data going to and from the electronically coupled banks of each region located above each memory controller. For example, the memory controller 402 regulates the flow of data going to and from the banks 204-207 of the region 202, the flow of data going to and from the banks 501-504 of the region 506 of the memory layer 112, and the flow of data going to and from the regions of the memory layers 106-111 between the regions 202 and 506.

The number and arrangement of the memory controllers within the memory-controller layer 102 are determined by the number and arrangement of the regions within each of the memory layers. For example, expanding each of the memory layers 105-112 to include an additional five regions would result in expanding the memory-controller layer 102 to include an additional five memory controllers.

The internal architecture of the memory module 100 offers a number of advantages over conventional stacked memory architectures. First, because the architecture of the memory module 100 carries out electronic communications between memory layers and the memory controller 102 by way of internal through vias that operate as buses, the need for bond pads located on the perimeter of the memory layers and the memory controller and the need for mechanically attached bond leads to interconnect the memory layers with the memory-controller layer are eliminated. Second, stacking the memory layers with the memory controllers and including vias to provide electronic communications buses between the banks and the memory controllers reduces the distance, power, and access time needed for banks and memory controllers to exchange data. Additionally the integrated through vias (e.g. TSVs) are finer pitch connections which enable a larger number of electrical signal paths between the banks and memory controllers, thereby increasing bandwidth. Additionally, the multiple through via buses allow multiple memory controllers parallel access to memory. There are multiple points of access to memory.

Other embodiments of the present invention incorporate an optical interconnection layer ("optical layer") between a memory-controller layer and a stack of memory layers. This optical layer eliminates the need for external electronic connections between the memory-controller layer and a processor. As a result, the optical layer provides a number of advantages over conventional external electronic connections including reducing power consumption, providing a higher bandwidth due to dense wave division multiplexing ("DWDM"), reducing costs due to simple cable tracks and module insertions points, and eliminating the broadcast stub electronics problem.

Figure 6:
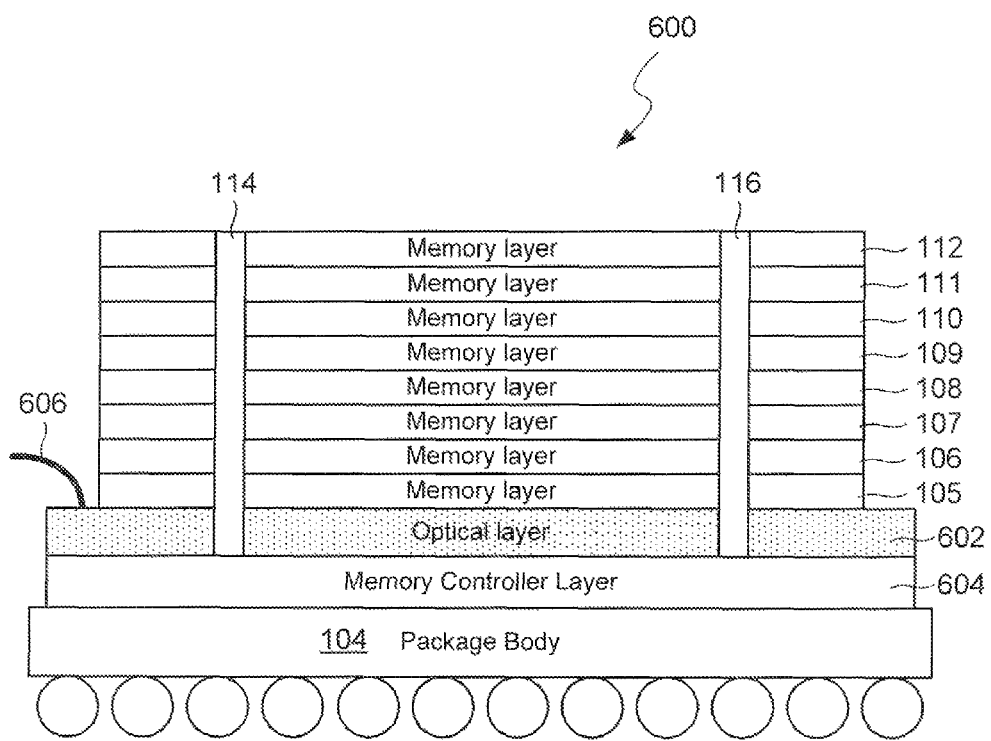
FIG. 6 shows a cross-sectional view of a second three-dimensional, optical memory module in accordance with embodiments of the present invention.

FIG. 6 shows a cross-sectional view of a three-dimensional, optical memory module 600 in accordance with embodiments of the present invention. The memory module 600 is identical to the memory module 100 except the external electronic connections included in the memory-controller layer 102 are replaced by an entirely separate optical layer 602 located between the bottom memory layer 105 and a memory-controller layer 604. In addition, the sets of data through vias and the sets of address and control through vias, represented by through vias 114 and 116, pass through the optical layer 602 and are approximately perpendicular to the memory-controller layer 602. The optical layer 602 implements a high data rate, DWDM optical link over which the memory module 600 receives commands, writes data, and responds with data or acknowledges data packets. DWDM provides multiplexing in a single optical fiber or waveguide. Separate parallel channels of light can be transmitted on a single waveguide with each channel corresponding to a different wavelength of light. An external optical interface to other devices, such as a processor, can be accomplished using one or more optical fibers, such as optical fiber 606, which are optically coupled to optical waveguides on the optical layer 602.

Figure 7:
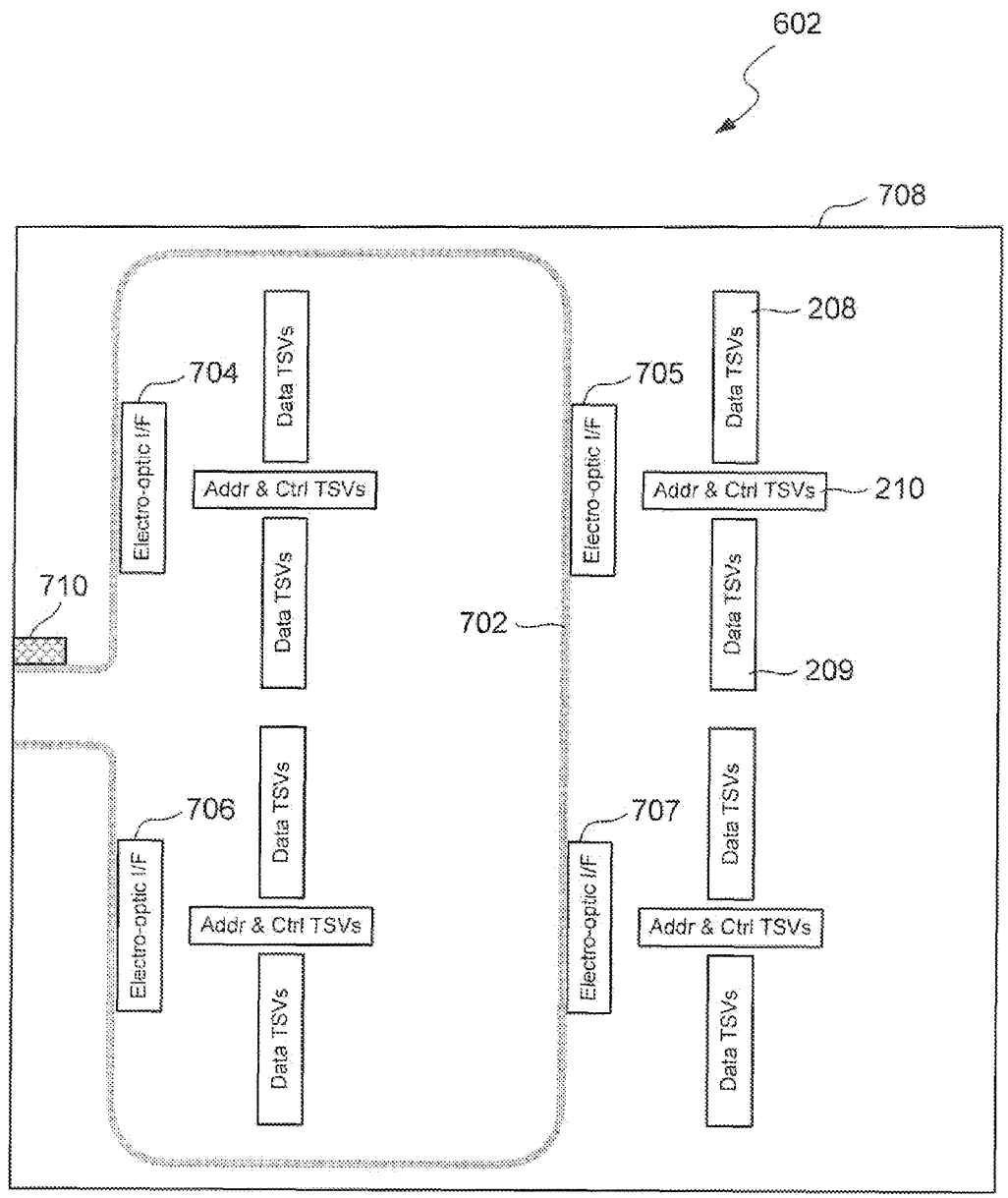
FIG. 7 shows an architecture of an optical layer of the memory module, shown in FIG. 6, in accordance with embodiments of the present invention.

FIG. 7 shows an architecture of the optical layer 602 of the memory module 600 in accordance with embodiments of the present invention. The optical layer 602 includes a bus waveguide 702, four electro-optic interfaces 704-707, and sub-regions that are dedicated to the sets of through via, e.g. TSVs, passing between the memory layers 105-112 and the memory control layer 604, such as data through vias 208 and 209 and address and control through vias 210. The bus waveguide 702 can be implemented in various configurations for carrying one or more wavelengths. For example, it can be a single waveguide with a single wavelength, a plurality of waveguides (preferably non-crossing) each carrying one or more wavelengths or a single waveguide carrying a plurality of wavelengths. The bus waveguide 702 can be a suitable dielectric material disposed on a silicon substrate 708. The bus waveguide 702 can be in optical communication with the electro-optic interfaces 704-707 which are implemented using nanophotonics such as silicon nanophotonics. Optical power can be provided by light sources such as laser sources either mounted on the optical layer 602, such as laser source 710, or from external light sources not mounted on the memory module whose optical power is received through an external optical interface such as optical fiber 606. For example, a light signal generated by an external system such as a processor system can be received via the optical connection 606.

The laser sources can also be integrated mode-locked lasers. The task of tuning the output wavelengths of the laser sources to the wavelengths of the detectors of the electro-optic interfaces 704-707 is simplified because only one wavelength of the laser needs to be actively stabilized. The wavelengths of the remaining channels may differ from that of the reference wavelength by an integer multiple of the mode-locking frequency and either passive or active mode locking can be used. When the laser cavity of the laser sources is fabricated using the same material as the bus waveguide 702 with a III-V semiconductor gain region wafer-bonded to a resonator, then so long as the laser source is located on the same board as the memory module 600, the wave division multiplexed channels and the laser reference wavelength coarsely track the ambient temperature changes in the environment, simplifying the active stabilization system.

Figure 8:
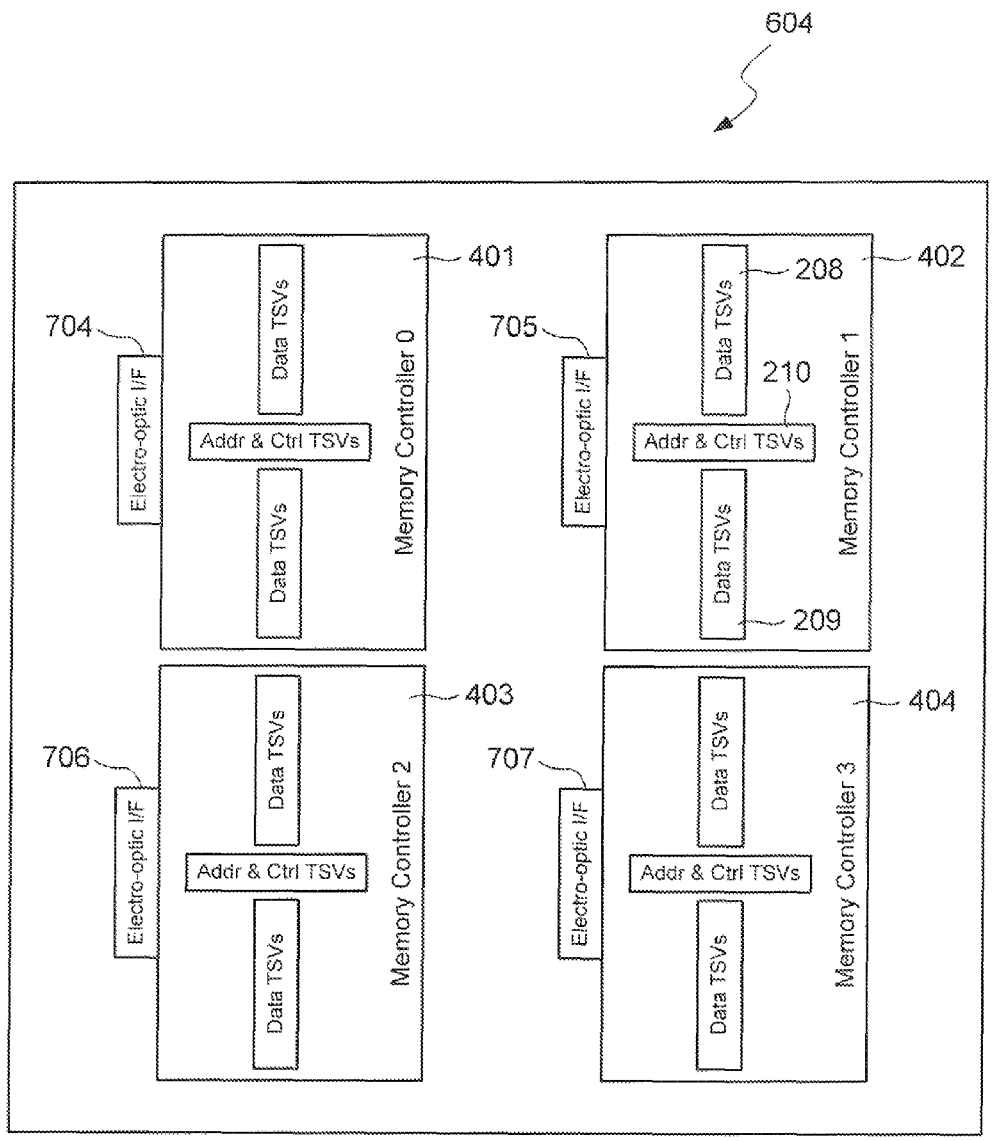
FIG. 8 shows an architecture of a memory-controller layer of the memory module, shown in FIG. 6, in accordance with embodiments of the present invention.

FIG. 8 shows an architecture of the memory-controller layer 604 of the memory module 600 in accordance with embodiments of the present invention. The memory controller is identical to the memory-controller layer 102, shown in FIG. 4, except the memory-controller layer 604 includes the same electro-optic interfaces 704-707, which are also electronically coupled to the memory controllers 401-404, respectively. The electro-optic interfaces 704-707 convert optical channels transmitted in the bus waveguide 702 into electronic signals that are electronically communicated to the memory controllers 401-404 via the electro-optic interfaces 704-707.

Figure 9:
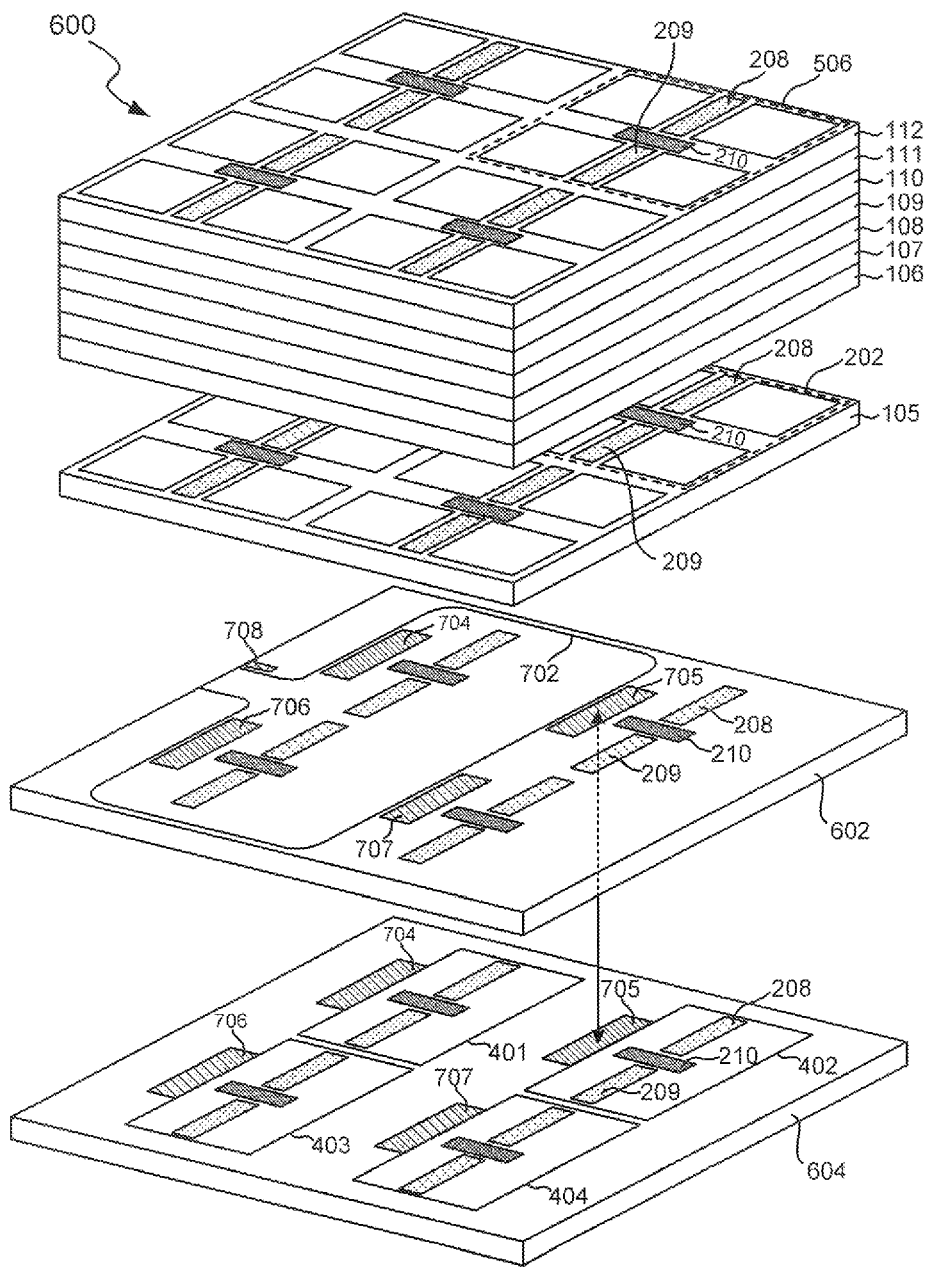
FIG. 9 shows an exploded isometric view of the memory module, shown in FIG. 6, in accordance with embodiments of the present invention.

FIG. 9 shows an exploded isometric view of the memory module 600 in accordance with embodiments of the present invention. The bottom memory layer 105, the optical layer 602, and the memory-controller layer 604 are shown separated from each other and the remaining memory layers 106-112 in order to reveal the alignment of the electro-optic interfaces 704-707 and the memory controllers 401-404 with regions of the memory layers 105-112. FIG. 9 reveals that the sets of data through vias and the sets of address and control through vias are buses extending through the memory layers 105-112 and the optical layer 602 approximately perpendicular to the memory controllers 401-404. The banks of each region within each memory layer are in electronic communication with one of the four memory controllers 401-404 as described above with reference to FIG. 5. The electro-optic interfaces 704-707 extend from the memory-controller layer 604 into the optical layer 602 and are in electronic communication with the memory controllers 402-404 and in optical communication with the bus waveguide 702. For example, the electro-optic interface 705 is in electronic communication with memory controller 402 of the memory-controller layer 604 and in optical communication with the bus waveguide 702 of the optical layer 602. Detectors within the electro-optic interfaces 704-707 receive optical signals from the bus waveguide 702 and convert the optical signals into electronic signals that are electronically communicated to the electronically coupled memory controllers 401-404, respectively. Outputting signals of response data onto the bus waveguide 702 can be achieved by each of the electro-optic interfaces 704-707 by modulating the intensity of channels transmitted along the bus-waveguide 702.

In operation, the memory module 600 receives commands over the optical fiber 606 to read data blocks from and write data blocks to the banks of the memory layers 105-112. The data blocks are typically the size of a processor cache line. For example, data blocks can be 64 or 128 bytes. Each of the individual memory controllers described above with reference to memory module 100 and memory module 600 responds to a different section of the address range, with the address range being contiguous within a module. The memory controllers then initiate a read or write operation on its corresponding control, address, and data through vias. The memory controllers assert a read or write memory request that identifies which of the multiple stacked memory layers is being accessed. The memory request also identifies a particular bank within the memory layer in the case where multiple banks of the memory layer share the same data through vias. Each individual memory request is therefore handled by a single bank on a single memory layer. The memory controllers are also responsible for all other functions, such as refresh and error correction codes. Using vias with an approximately 25 micron pitch, the area overhead of the through vias may be less 3% of the memory layer, assuming 4 channels per memory controller. Through vias with a pitch less than approximately 50 microns, may allow the memory layer to be structured so as to supply an entire cache line from a single row access.

Figure 10A:
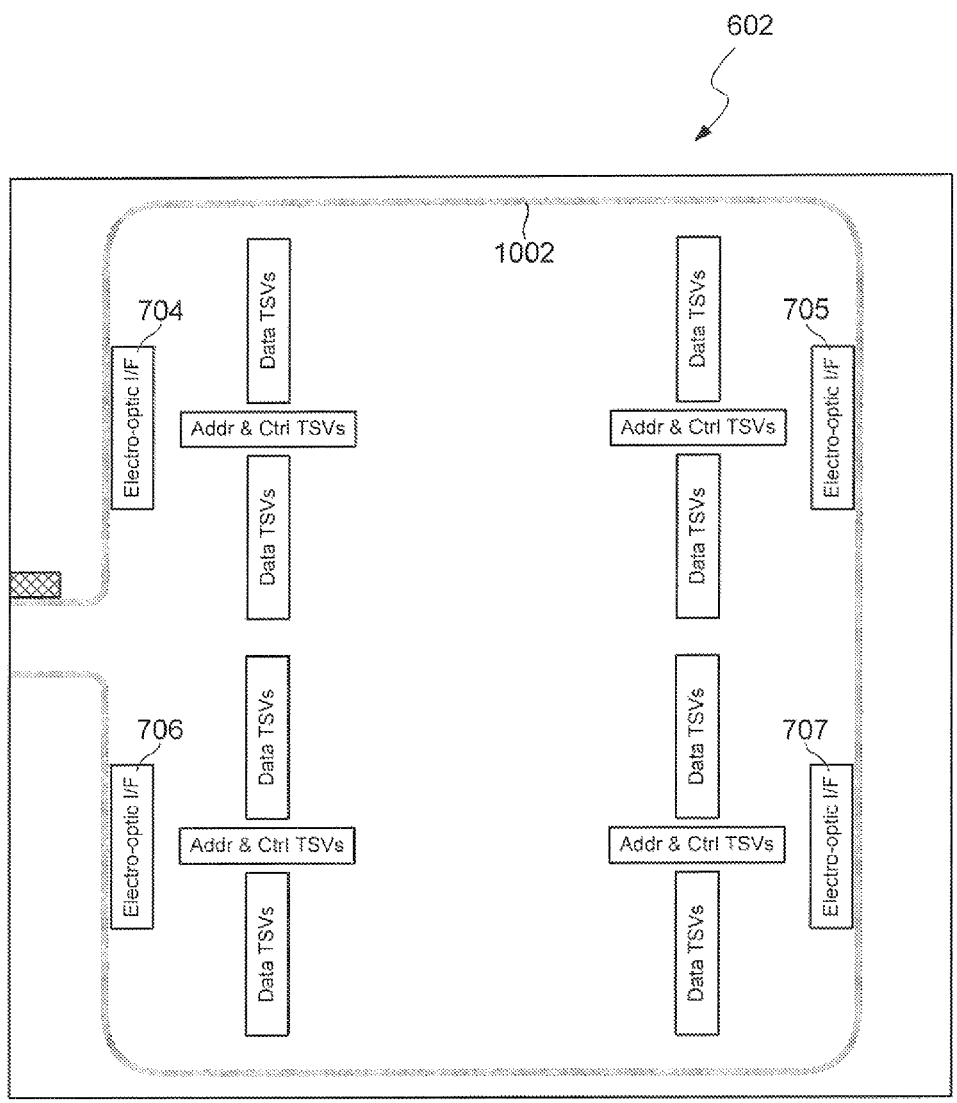
FIGS. 10A-10B show two examples in which a bus waveguide and four electro-optic interfaces of an optical layer can be arranged in accordance with embodiments of the present invention.
Figure 10B:
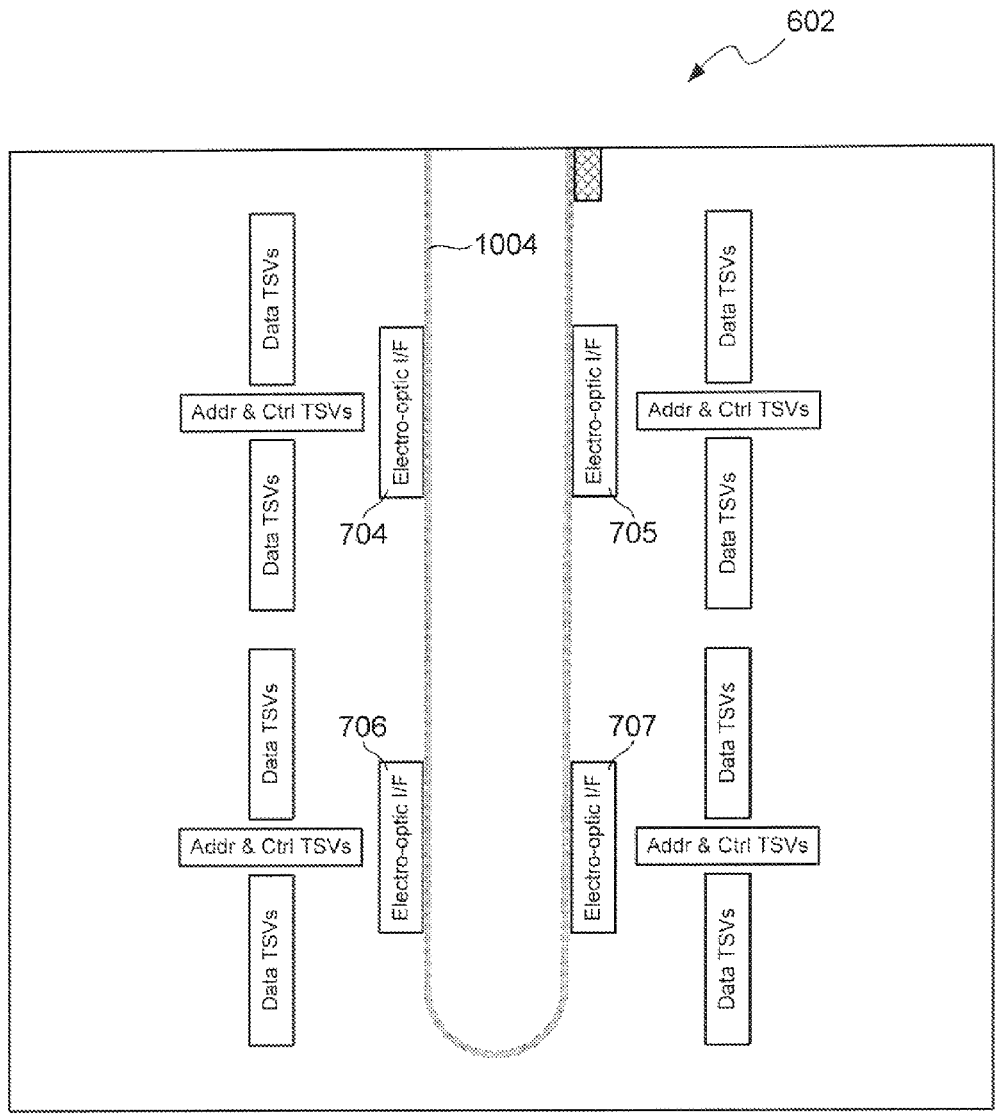

The configuration of the bus waveguide 702 and the arrangement of the electro-optic interfaces, shown in FIGS. 7-9, represent just one of many different arrangements. In other embodiments, the length of the bus waveguide 702 can be increased and two of the electro-optic interfaces can be repositioned on the optical layer 602 so that all of the electro-optic interfaces are disposed on the outside of the optical layer 602, as shown in FIG. 10A. In still other embodiments, the length of the bus waveguide 702 can be reduced and two of the electro-optic interfaces can be repositioned on the optical layer 602 so that all of the electro-optic interfaces are disposed on the inside of the optical layer 602, as shown in FIG. 10B. In other embodiments, the banks and through vias can be rearranged as described above with reference to FIG. 3, and the number of electro-optic interfaces can be changed to match the number of regions employed.

Figure 11A:
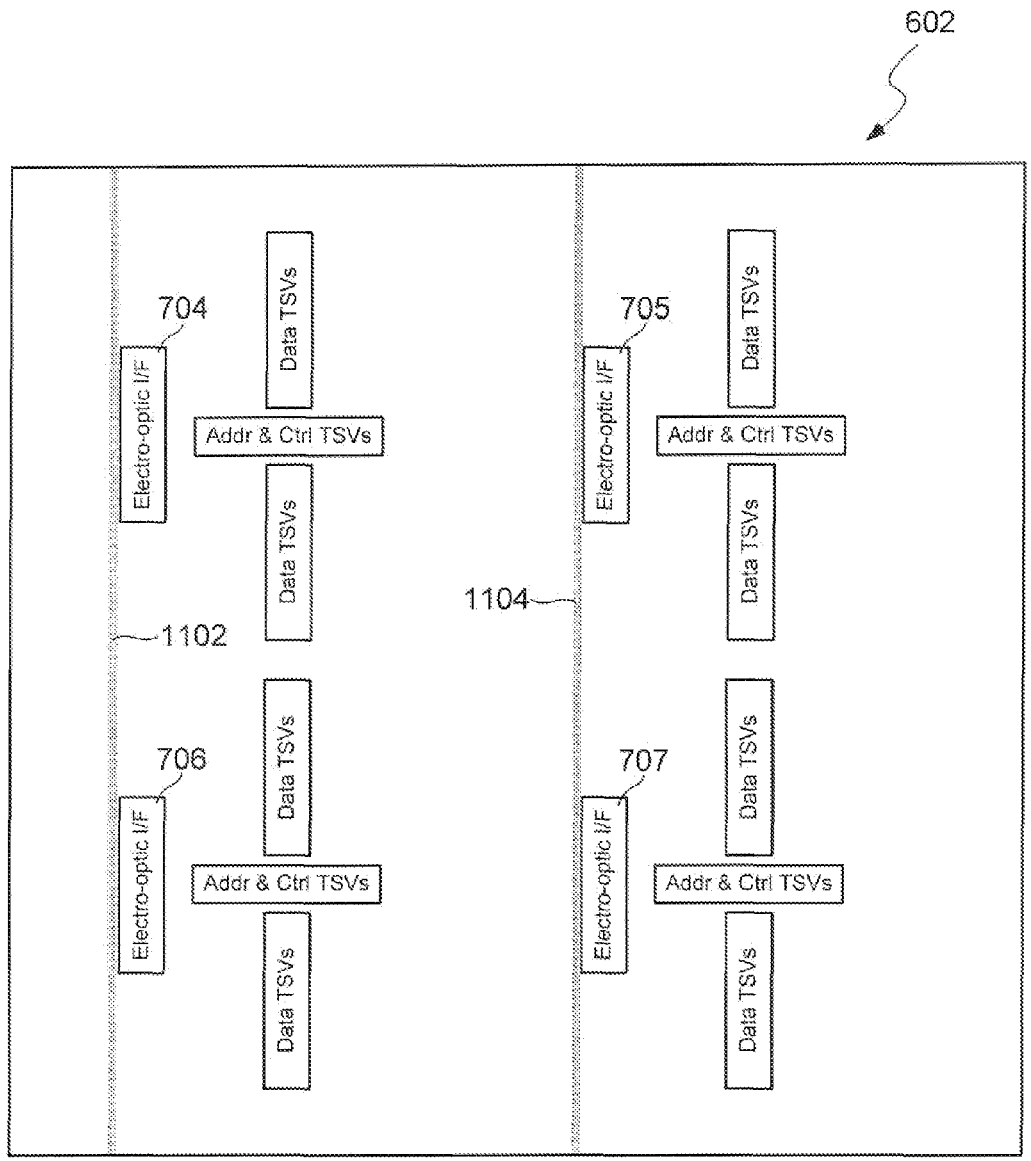
FIG. 11A shows an optical layer of a three-dimensional memory module implemented to with two separate bus waveguides in accordance with embodiments of the present invention.
Figure 11B:
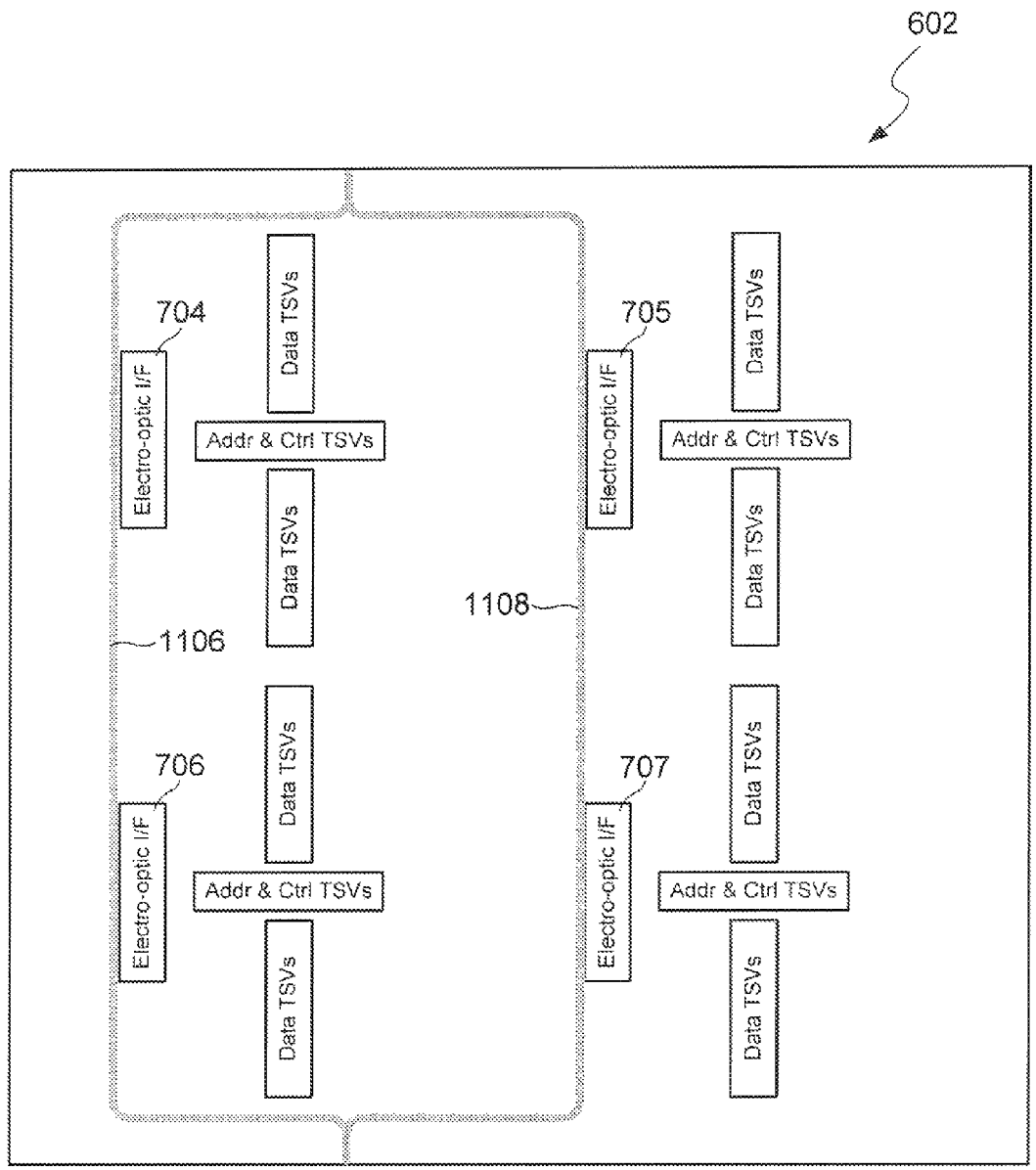
FIG. 11B shows an optical layer of a three-dimensional memory module implemented with a plurality of branching bus waveguides in accordance with embodiments of the present invention.

Embodiments of the present invention are not limited to a single bus waveguide 702. In other embodiments, a single bus waveguide can be replaced by different bus waveguides, each bus waveguide having access to a subset of the electro-optic interfaces. For example, FIG. 11A shows the optical layer 602 implemented with two separate bus waveguides 1102 and 1104 in accordance with embodiments of the present invention. In other embodiments, the bus waveguide can be reconfigured to include branching waveguides and two or more bus waveguides that can be used to access various suitable arrangements of the electro-optic interfaces. For example, FIG. 11B shows the optical layer 602 implemented with two branching bus waveguides 1106 and 1108 in accordance with embodiments of the present invention. In order to increase the optical bandwidth, bus waveguides 702, 1002, 1004, 1102, and 1104 can each be replaced by two or more approximately parallel bus waveguides, where two or more of the approximately parallel bus waveguide can be optically coupled to a different electro-optic interface. The use of DWDM optical communication between a processor and the memory controllers of the memory-controller layer allows multiple channels to be used at one time. Furthermore, the electrical memory channels employed in the present invention are contained within the stack of memory layers, which means that the cost added to the memory controller goes up more slowly with optical connections than it would in an all electronic memory device.

Figure 12:
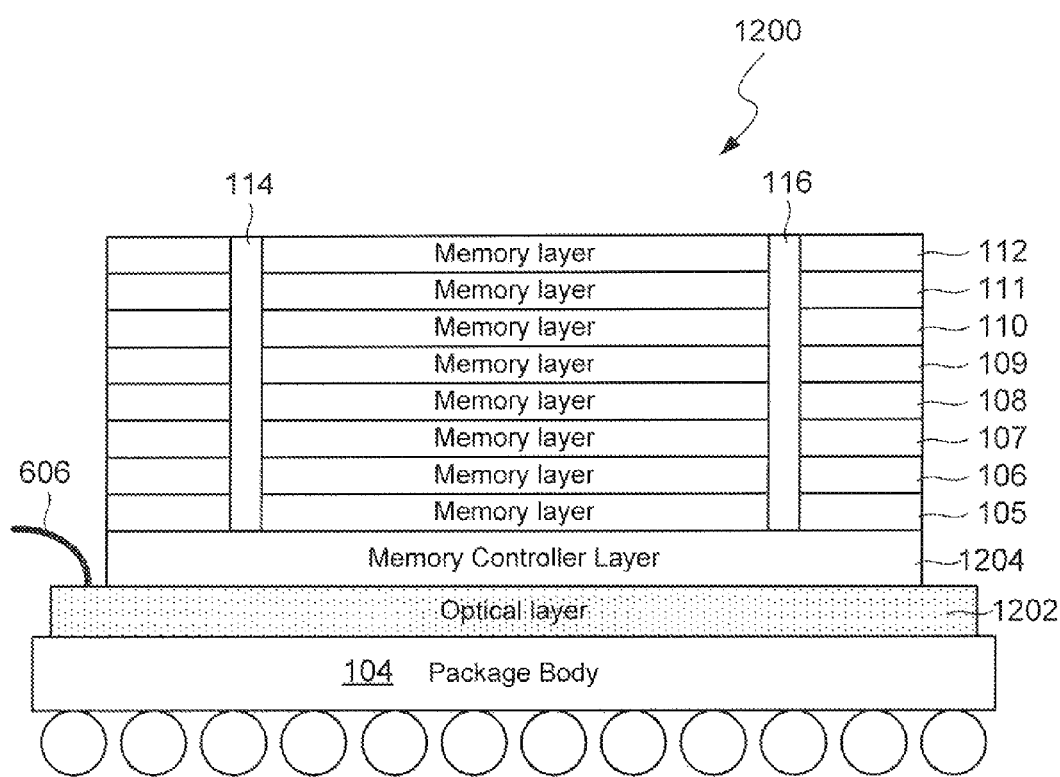
FIG. 12 shows a cross-sectional view of a third three-dimensional, electronic memory module in accordance with embodiments of the present invention.
Figure 13:
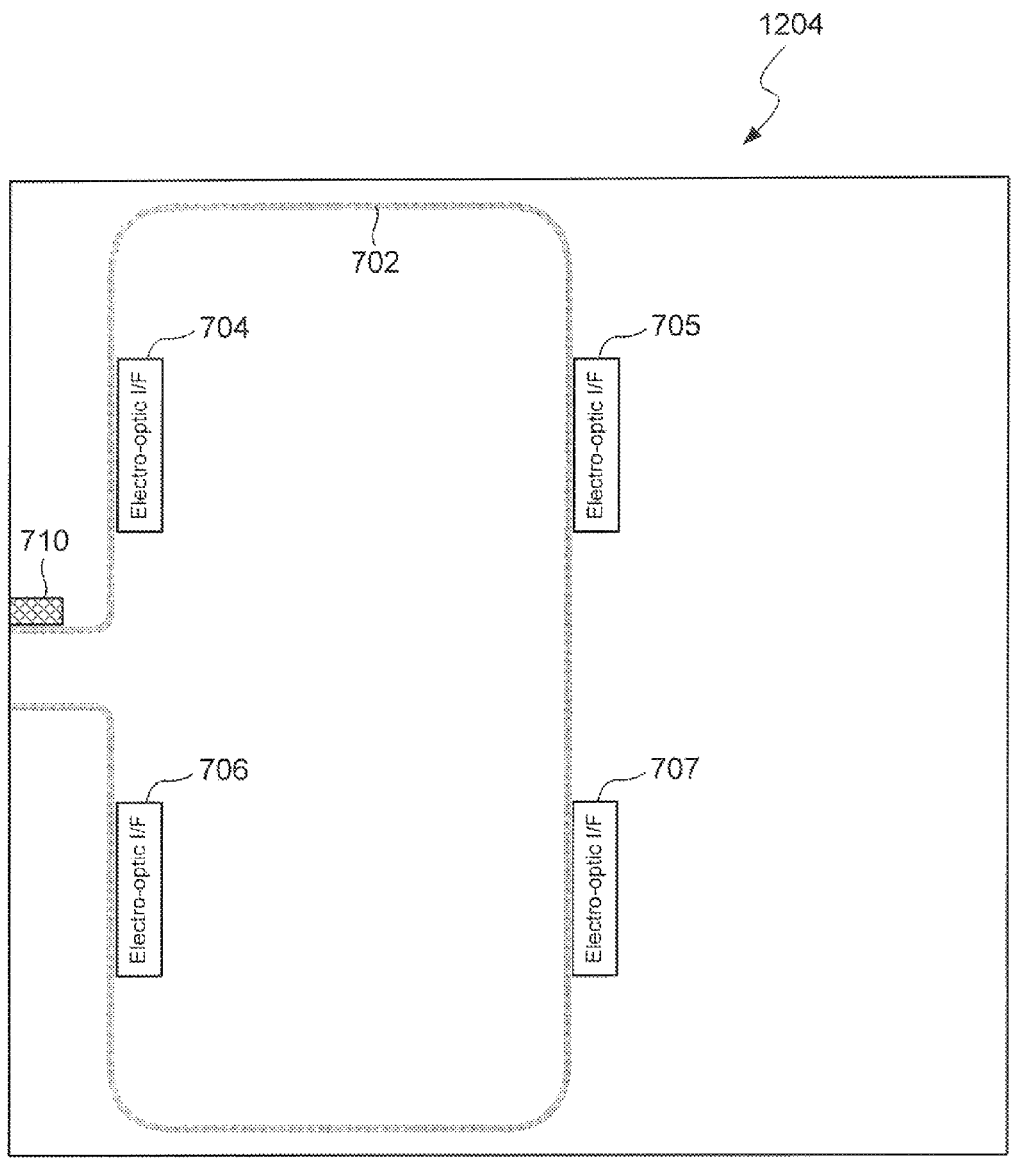
FIG. 13 shows a top view of an optical layer in accordance with embodiments of the present invention.
Figure 14:
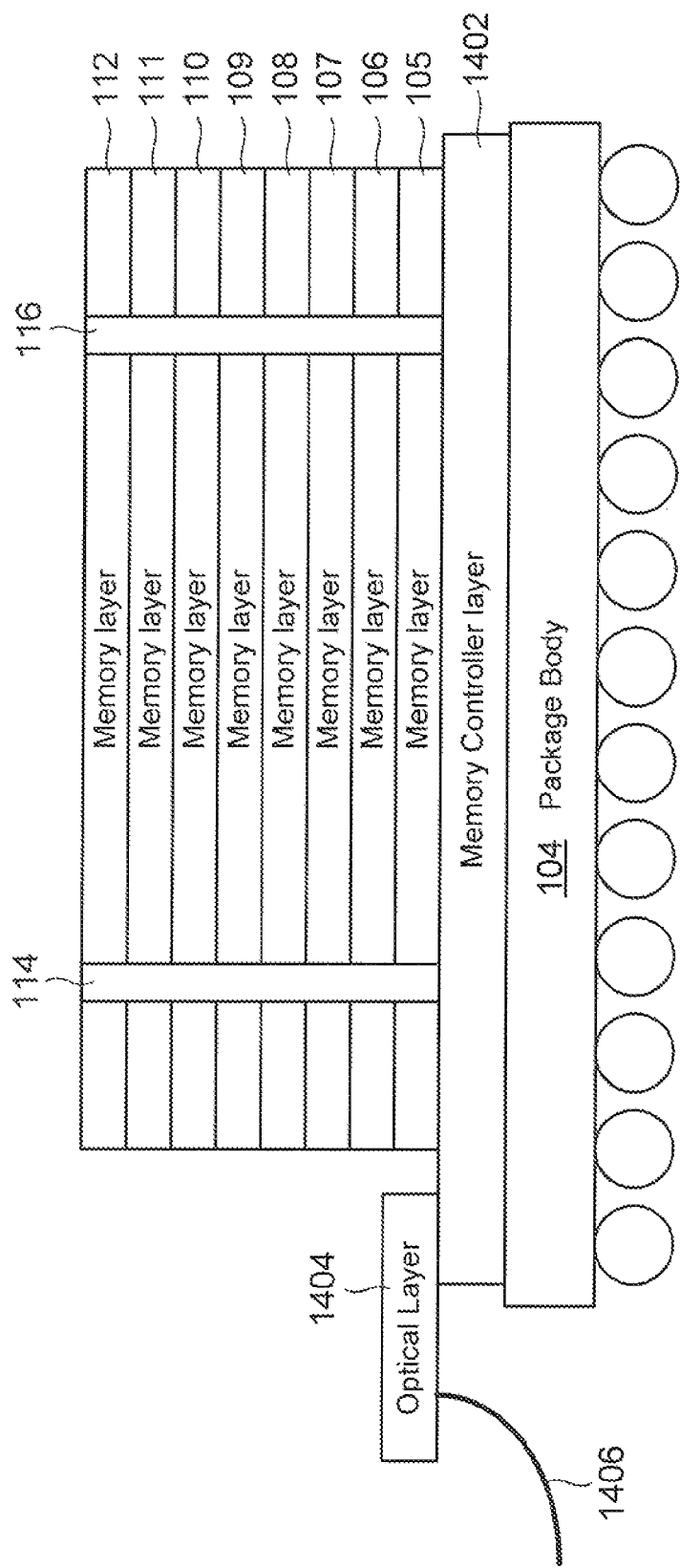
FIG. 14 shows a cross-sectional view of a fourth three-dimensional, electronic memory module in accordance with embodiments of the present invention.

Although the present invention has been described in terms of particular embodiments, it is not intended that the invention be limited to these embodiments. Modifications within the spirit of the invention will be apparent to those skilled in the art. For example, in other embodiments of the present invention, the order and orientation of the device layers in the stack is not limited to order of layers shown in FIGS. 1 and 6. In other embodiments, the device layers can have any suitable ordering. For example, the optical layer and the memory-controller layer described above with reference to FIG. 6 can be switched. FIG. 12 shows a cross-sectional view of a three-dimensional, electronic memory module 1200 in accordance with embodiments of the present invention. Unlike the memory module 600, the memory module 1200 includes an optical layer 1202 disposed on the top surface of a package body 104, and a memory-controller layer 1204 disposed on the top surface of the optical layer 1202. The memory module 1200 eliminates the need for extending the data, control, and address through vias through the optical layer, as described above with reference to FIG. 6. FIG. 13 shows a top view of the optical layer 1202 in accordance with embodiments of the present invention. In this embodiment, the optical layer 1202 is identical to the optical layer 602 but without the data, control, and address through vias. In other embodiments of the present invention, the memory module 100 can be modified by replacing the high speed external electronic interface with an optical interface. FIG. 14 shows a cross-sectional view of a memory module 1400 in accordance with embodiments of the present invention. The memory-controller layer 1402 is electronically coupled to an electro-optic interface of the optical layer 1404, which is optically coupled to an optical fiber 1406. In other embodiments, the memory modules 600 and 1200 may all include a separate analog layer positioned between the optical layer and the memory-controller layer. Such an analog layer can be used to convert digital signals from the memory controller to analog signals needed to control modulators or other devices on the optical layer, to convert analog outputs of photodetectors to digital signals to be input to the memory controller, or for other uses.

The architectures described above have a number of advantages over existing and proposed memory module designs in three main areas: access time, bandwidth, and power. In a typical DRAM device, the connection between banks is performed through global input/output wiring which, by comparison with the optical memory modules of the presenting invention, takes a significant amount of time to transmit data electronically across the DRAM device. In the optical memory module embodiments, the global input/output function is effectively performed by the optical layer, where data can be transmitted without buffers and repeaters. The architecture of the optical memory module also allows larger numbers of smaller banks to be used. This improves the access time in two ways. First, the access time off an individual bank is faster, and second, the probability of a bank conflict is reduced. A bank conflict occurs when a memory access occurs on a memory bank that is still handling a previous request, which causes the latter access to block the former until the preceding request has completed increasing the effective access time for the second access.

The uses of a DWDM optical interconnect allows much higher bandwidth connection to the memory module. Although a similar electronic interconnect could be implemented, the result may either be reduced bandwidth due to limited input/output pins or a significant increase in cost due to employing a larger number of input/output pins. Another disadvantage of the electronic signaling option may be the excessive power required to drive this input/output at high speed. Furthermore, the per bit transmission energy requirement for wires fundamentally scales linearly with wire length for a given set of wire properties. The energy requirement for optical transmission is dominated by the send-side (electrical to optical conversion) and the receive-side (optical to electrical conversion) and is effectively independent of length for the scales of interest for computer memory systems. The only electronic input/output required for the optically connected memory module may be power, ground, and low speed control and monitoring signals. The use of DWDM on the optical interface means that only a small number of fibers, perhaps even a single fiber for transmitting optical signals on and off the memory module, are needed. Optical communication between a processor and/or a motherboard and main memory has a significant advantage in terms of signal integrity and synchronization. Electronic solutions are plagued by jitter, reflections, and cross talk. All of these problems are significantly reduced in the optical domain.

The power consumption of the memory module is reduced in a number of ways. First, the use of small memory regions reduces the access power for an individual region since the bit and word line capacitances are smaller. Second, the fact that a single region supplies an entire cache line reduces the device access power compared to module organizations, where multiple regions contribute to a cache line, since the amount of data which is read into the sense amplifiers and not subsequently needed for the memory request is greatly reduced. As previously noted the input/output structures also consume significantly less power through the use of optical interconnects both for the external connectivity, and for the memory global function. A further advantage of the architecture may be that it is highly scalable, as described above. When adding devices to any stacked configuration one of the limiting factors is power. In the case of the optically connected memory module, additional memory layers do not significantly increase the need for power. The input/output power also remains substantially constant, with only the refresh power scaling as the number of memory layers increases.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A memory module comprising:
   a memory-controller layer including at least one memory controller;
   at least one memory layer in a stack with the memory-controller layer;
   an optical layer adjacent to the memory-controller layer and including a bus waveguide that lies within the optical layer, the bus waveguide having a first end to receive optical channels and a second end to send optical channels;
   at least one electro-optic interface to convert optical channels input to the first end of the bus waveguide into electronic signals to be sent to the at least one memory controller and convert electronic signals received from the at least one memory controller into optical channels to be output from the second end of the bus waveguide, wherein the at least one electro-optic interface is within both the optical layer and the memory-controller layer; and
   at least one set of through vias extending approximately perpendicular to a surface of the least one memory controller through the stack, each set of through vias including:
      data through vias through which data is transmitted to and from the at least one memory layer;
      address through vias through which a physical address of data stored in the at least one memory layer is transmitted to the at least one memory layer; and
      control through vias through which commands and status signals are transmitted to and from the at least one memory layer, wherein the at least one set of at least one through vias provide electronic communication between the at least one memory controller and one of the at least one memory layers.

2. The memory module of claim 1 wherein the at least one memory layer further comprises regions, each region having at least one bank in electrical communication with the at least one memory controller via one set of the at least one set of through vias.

3. The memory module of claim 1 wherein the at least one set of through vias providing electronic communication between the at least one memory layer and the memory-controller layer further comprises the at least one set of through vias electronically coupled to at least one memory hank of the at least one memory layer and electronically coupled to the at least one memory controller of the memory-controller layer.

4. The memory module of claim 1 wherein the electro-optic interfaces further comprise:
   at least one detector to convert the optical channels input to the first end of the waveguide into the electronic signals; and
   at least one modulator to convert the electronic signals received from the at least one memory controller into the optical channels to be output from the second end of the bus waveguide.

5. The memory controller of claim 1 wherein the at least one set of at least one through vias further comprises approximately regularly arranged through vias with center-to-center spacing of less than approximately 50 microns.

6. The memory module of claim 1 wherein the optical layer is positioned between the memory-controller layer and the at least one memory layers and the through vias extend through the optical layer.

7. The memory module of claim 1 wherein the at least one electro-optic interface is in optical communication with the at least one bus waveguide and in electronic communication with the at least one memory controller.

8. The memory module of claim 1 wherein the optical layer further comprises an integrated mode locked laser optically coupled to the first end of the at least one bus waveguide.

9. The memory module of claim 1 wherein the at least one memory layer further comprises at least one bank disposed on a substrate and positioned adjacent to the at least one set of through vias.

10. The memory module of claim 9 wherein the at least one bank disposed on the substrate and positioned adjacent to the at least one set of through vias further comprises bit lines of the at least one bank pitch matched to the through vias.

11. The memory module of claim 9 wherein the at least one bank disposed on the substrate and positioned adjacent to the at least one set of through vias further comprises hit lines that match the bandwidth of the through vias.

12. The memory module of claim 9 wherein the at least one bank further comprises:

a number of bit lines; and a number of sense amplifiers located near an edge of the bank adjacent to the at least one set of through vias, each sense amplifier electronically coupled to a bit line.

13. The memory modules of claim 9 wherein at least one bank further comprises a number of bit lines in electronic communication with a through via of the set of through vias.

14. The memory module of claim 13 wherein the number of bit lines in electronic communication with the through via further comprises a multiplexer electronically coupled to the number of hit lines and electronically coupled to the through via, wherein the multiplexer combines outputs from the bit lines into a single selected data output on the through via.

15. The memory module of claim 1 wherein the through vias further comprise one of:

metalized vias; or through silicon vias.

16. The memory module of claim 1 wherein each layer in the stack has a thickness ranging from approximately 20-50 microns.

* * * * *

UNITED STATES PATENT AND TRADEMARK OFFICE
CERTIFICATE OF CORRECTION

| | | |
|---|---|---|
| PATENT NO. | : 8,059,443 B2 | Page 1 of 1 |
| APPLICATION NO. | : 11/975963 | |
| DATED | : November 15, 2011 | |
| INVENTOR(S) | : Moray McLaren et al. | |

It is certified that error appears in the above-identified patent and that said Letters Patent is hereby corrected as shown below:

In column 12, line 48, in Claim 3, delete "hank" and insert -- bank --, therefor.

In column 13, line 19, in Claim 11, delete "hit" and insert -- bit --, therefor.

In column 14, line 11, in Claim 14, delete "hit" and insert -- bit --, therefor.

Signed and Sealed this
Sixth Day of November, 2012

David J. Kappos
*Director of the United States Patent and Trademark Office*